United States Patent
Kim et al.

(10) Patent No.: US 9,219,477 B2
(45) Date of Patent: Dec. 22, 2015

(54) NON-CONTACT SWITCH

(71) Applicant: DAESUNG ELECTRIC CO., LTD., Ansan-si, Gyeonggi-do (KR)

(72) Inventors: Myung O Kim, Ansan-si (KR); Weon Ho Lee, Suwon-si (KR); Kyu Sung Cho, Ansan-si (KR)

(73) Assignee: DAESUNG ELECTRIC CO., LTD., Ansan-Si (KR)

( * ) Notice: Subject to any disclaimer, the term of this patent is extended or adjusted under 35 U.S.C. 154(b) by 383 days.

(21) Appl. No.: 13/988,012

(22) PCT Filed: Dec. 10, 2012

(86) PCT No.: PCT/KR2012/010713
§ 371 (c)(1),
(2) Date: May 16, 2013

(87) PCT Pub. No.: WO2014/081065
PCT Pub. Date: May 30, 2014

(65) Prior Publication Data
US 2014/0139045 A1    May 22, 2014

(51) Int. Cl.
*H01H 35/00*    (2006.01)
*H03K 17/97*    (2006.01)

(52) U.S. Cl.
CPC ............ *H03K 17/97* (2013.01); *B60K 2350/00* (2013.01); *Y10T 307/766* (2015.04)

(58) Field of Classification Search
CPC . H03K 17/97; B60K 2350/00; Y10T 307/766
See application file for complete search history.

(56) References Cited

U.S. PATENT DOCUMENTS

| | | | | |
|---|---|---|---|---|
| 6,356,741 | B1* | 3/2002 | Bilotti et al. | 455/90.1 |
| 2002/0155015 | A1* | 10/2002 | Esumi et al. | 418/179 |
| 2013/0193314 | A1* | 8/2013 | Schweninger et al. | 250/214 SW |
| 2014/0015596 | A1* | 1/2014 | Martin et al. | 327/517 |

FOREIGN PATENT DOCUMENTS

| JP | 2007-214045 A | 8/2007 |
|---|---|---|
| JP | 2009-252732 A | 10/2009 |

OTHER PUBLICATIONS

Office Action dated Mar. 27, 2015 of corresponding Japanese Patent Application No. 2014-548654—2 pages.

* cited by examiner

*Primary Examiner* — Daniel Cavallari
(74) *Attorney, Agent, or Firm* — Knobbe Martens Olson & Bear, LLP

(57) ABSTRACT

The present disclosure relates to a non-contact switch. More particularly, the non-contact switch includes a button which is disposed at a predetermined position of a housing and operated by an external pressure while being formed, at one end portion thereof, with a magnetic substance; a magnetic field sensor device which is accommodated in the housing to face the magnetic substance and generates an induced voltage depending on an interval between the magnetic field sensor device and the magnetic substance; and a semiconductor device which is driven by the induced voltage generated at the magnetic field sensor device to switch power supplied from a separate battery to a separate load.

7 Claims, 3 Drawing Sheets

NON-CONTACT SWITCH

TECHNICAL FIELD

The present invention relates to a non-contact switch, and more particularly, to a non-contact switch which drives a semiconductor device with a voltage induced at a magnetic field sensor device using a magnetic substance formed at a lower end portion of a button in the switch so as to switch a current supplied from a battery to a load.

BACKGROUND ART

Generally, in a case of a switch for controlling the flow of a current supplied from a battery to a load, particularly a switch used in a vehicle, a contact structure is mainly adopted which closes or opens an electric path from the battery to the load using an external pressure. A switch having such a contact structure has an advantage of being easily produced owing to its simple configuration. However, there are problems in that, when the switch is used for a long time, the switch itself has poor durability due to abrasion of a contact region and noise is caused according to a change in shape of the abraded contact region.

Thus, a variety of non-contact switches have been proposed to overcome the problems of the existing switch. As an example of this related art, a technical configuration using an optical sensor (see Korean Patent No. 0275150) and a technical configuration using an infrared sensor (see Korean Utility Model No. 0180845) are disclosed. However, unlike the related art, the present invention discloses a non-contact switch to resolve the above-mentioned problems of the switches having the contact structure described below.

DISCLOSURE

Technical Problem

An object of the present invention is to provide a non-contact switch to resolve problems of an existing contact switch in which, when the switch is used for a long time, the switch has poor durability due to damage by abrasion of a contact region and noise is caused at the contact region during an operation of the switch.

Technical Solution

In accordance with an aspect of the present invention, a non-contact switch includes a button which is disposed at a predetermined position of a housing and operated by an external pressure while being formed, at one end portion thereof, with a magnetic substance; a magnetic field sensor device which is accommodated in the housing to face the magnetic substance and generates an induced voltage depending on an interval between the magnetic field sensor device and the magnetic substance; and a semiconductor device which is driven by the induced voltage generated at the magnetic field sensor device to switch power supplied from a separate battery to a separate load.

The magnetic field sensor device may be any one of a hall device, a reed switch, an AMR (Anisotropic Magneto-Resistive) sensor, and a GMR (Giant Magneto-Resistive) sensor.

The semiconductor device may be any one of a FET (Field Effect Transistor), a transistor, an electromagnetic relay, an IPS (Intelligent Power Switching) device, a MOSFET (Metal Oxide Semiconductor Field Effect Transistor), and an IGBT (Insulated Gate Bipolar Transistor).

The button may be operated in a push manner by an external pressure at a predetermined position of the housing, or in a sliding manner by an external pressure at a predetermined position of the housing.

The magnetic field sensor device may be disposed on a PCB (Printed Circuit Board).

The semiconductor device may be disposed on the PCB.

The power may be any one of a current and a voltage.

Advantageous Effects

Unlike an existing switch adopting a contact structure, a switch according to the present invention has an effect of removing noise which may be caused during an operation of the switch together with an improvement in durability compared with the existing switch, by realizing a non-contact structure using a magnetic field sensor device and a semiconductor device.

MODE FOR INVENTION

It will be noted that configurations not directly related to the technical subject of the present invention are omitted from the scope of the invention, prior to the specific description of the embodiments of the invention. In addition, technical terminologies or terms used in the specification and the claims should be construed to be true to the technical sprit of the invention based on the principle in which the inventor defines the concepts of the proper terms in order to explain his or her invention in the optimal manner.

A non-contact switch according to the present invention includes a button which is disposed at a predetermined position of a housing and operated by an external pressure while being formed, at one end portion thereof, with a magnetic substance; a magnetic field sensor device which is accommodated in the housing to face the magnetic substance and generates an induced voltage depending on an interval between the magnetic field sensor device and the magnetic substance; and a semiconductor device which is driven by the induced voltage generated at the magnetic field sensor device to switch power supplied from a separate battery to a separate load.

The magnetic field sensor device is preferably any one of a hall device, a reed switch, an AMR (Anisotropic Magneto-Resistive) sensor, and a GMR (Giant Magneto-Resistive) sensor, but is not limited thereto.

The semiconductor device is preferably any one of a FET (Field Effect Transistor), a transistor, an electromagnetic relay, an IPS (Intelligent Power Switching) device, a MOSFET (Metal Oxide Semiconductor Field Effect Transistor), and an IGBT (Insulated Gate Bipolar Transistor), but is not limited thereto.

The button is preferably operated in a push manner by an external pressure at a predetermined position of the housing, or in a sliding manner by an external pressure at a predetermined position of the housing.

The magnetic field sensor device and the semiconductor device are preferably disposed on a PCB (Printed Circuit Board, hereinafter referred to as "PCB").

The power is preferably any one of a current and a voltage.

Figure 1:
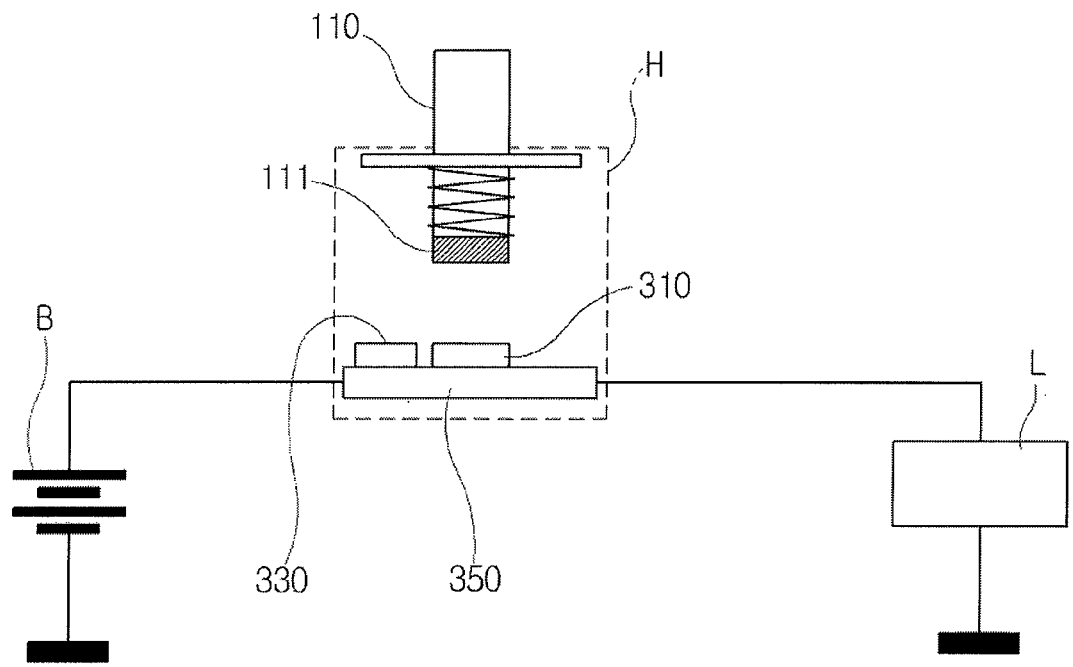
FIGS. 1 and 2 are exemplary views illustrating a non-contact switch according to a first embodiment of the present invention.
Figure 2:
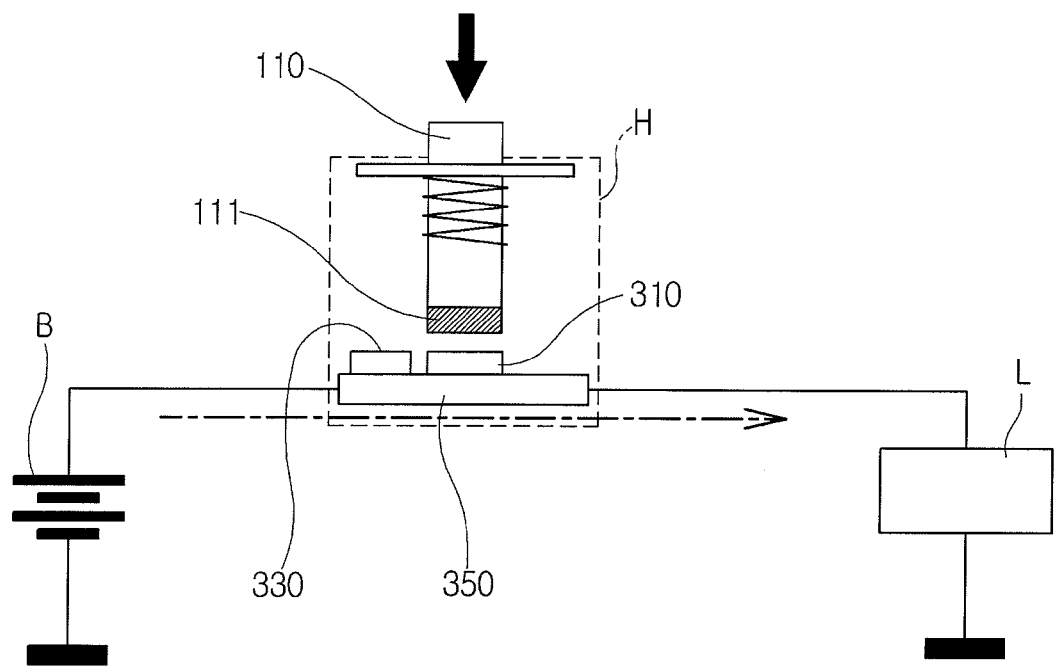

Hereinafter, a non-contact switch according to a first embodiment of the present invention will be described in detail with reference to the accompanying exemplary drawings. FIGS. 1 and 2 are exemplary views illustrating the non-contact switch according to the first embodiment of the present invention.

As shown in FIG. 1, the non-contact switch according to the present invention includes a button 110 which is disposed at an upper surface of a housing H and operated by an external pressure while being formed, at a lower end portion thereof, with a magnetic substance 111, a hall device as a magnetic field sensor device 310 which is disposed on a PCB 350 accommodated within the housing H, and an IPS device as a semiconductor device 330.

In this case, as shown in FIG. 2, when an external pressure is applied to the button 110, the button 110 is preferably operated in a push manner, namely, to move in a direction perpendicular to an outside surface of the housing H at which the button 110 is disposed, but the invention is not limited thereto.

As described above, when a clearance between the hall device and the magnetic substance 111, which is formed at the lower end portion of the button 110, is decreased as the button 110 moves inward of the housing H from the outside surface thereof in response to the external pressure, an induced voltage is generated at the hall device, thereby turning on the IPS device. Consequently, a current is output from a separate battery B connected to an input terminal of the IPS device via the IPS device. In this case, the IPS device switches the flow of the current so that the current flows from the separate battery B via an electric path formed on the PCB 350 to a separate load L.

In contrast, when the clearance between the hall device and the magnetic substance 111, which is formed at the lower end portion of the button 110, is increased as the button 110 moves toward the outside surface of the housing H from the inside thereof in response to the external pressure, the generation of the induced voltage at the hall device is stopped, thereby turning off the IPS device. Consequently, the IPS device switches the flow of the current so that the current flowing from the separate battery B via the electric path formed on the PCB 350 to the separate load L is cut off.

For example, in a case where the non-contact switch is used as a switch for lighting of a brake indicator lamp of a vehicle, when a driver steps on a brake of the vehicle, the button 110 is pushed by the pressure transferred to the brake. Thus, the IPS device is turned on by the induced voltage generated as the clearance between the hall device and the magnetic substance 111, which is formed at the lower end portion of the button 110, is decreased. Consequently, the current flows from the battery of the vehicle to the brake indicator lamp thereof so as to turn on the brake indicator lamp.

In contrast, when the driver does not step on the brake of the vehicle, the IPS device is turned off as the clearance between the hall device and the magnetic substance 111, which is formed at the lower end portion of the button 110, is increased. Consequently, the current flowing from the battery of the vehicle to the brake indicator lamp thereof is cut off so as to turn off the brake indicator lamp.

Figure 3:
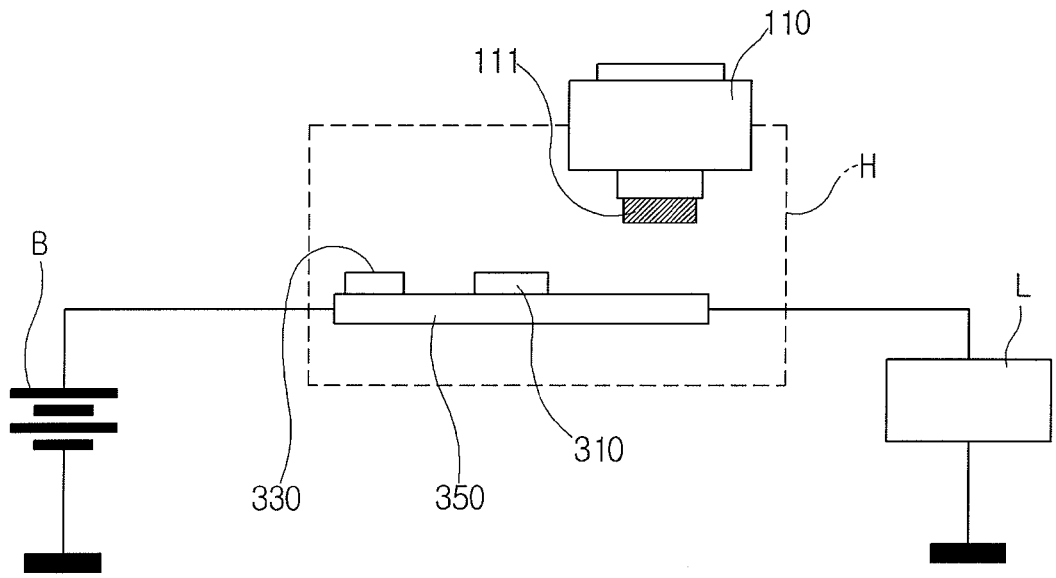
FIGS. 3 and 4 are exemplary views illustrating a non-contact switch according to a second embodiment of the present invention.
Figure 4:
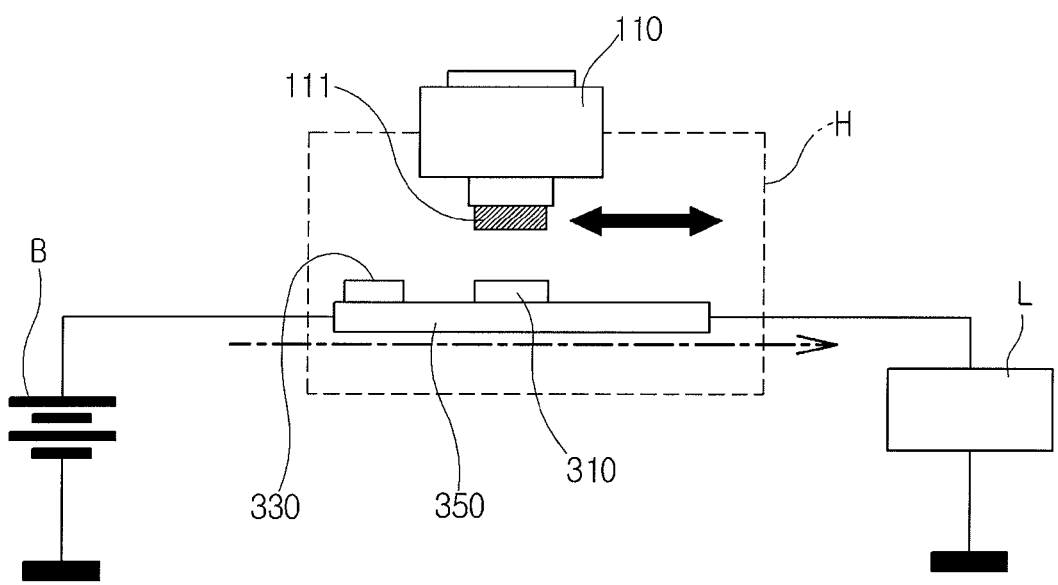

Hereinafter, a non-contact switch according to a second embodiment of the present invention will be described in detail with reference to the accompanying exemplary drawings. FIGS. 3 and 4 are exemplary views illustrating the non-contact switch according to the second embodiment of the present invention.

Similarly to the above-mentioned first embodiment, the non-contact switch according to the second embodiment of the present invention includes a hall device as a magnetic field sensor device 310 and an IPS device as a semiconductor device 330. However, unlike the first embodiment, when an external pressure is applied to a button 110, the button 110 is preferably operated in a sliding manner, namely, to move in a horizontal direction of an outside surface of a housing H at which the button 110 is disposed, as shown in FIG. 3.

Accordingly, when the button 110 moves in the horizontal direction in response to the external pressure and the hall device and a magnetic substance 111, which is formed at a lower end portion of the button 110, come closer to each other, an induced voltage is generated at the hall device, as described above. Consequently, the IPS device is turned on to switch the flow of a current so that the current flows from a separate battery B to a separate load L. In contrast, when the hall device and the magnetic substance 111 are far from each other, the IPS device is turned off to switch the flow of the current so that the current flowing from the separate battery B to the separate load L is cut off.

Figure 5:
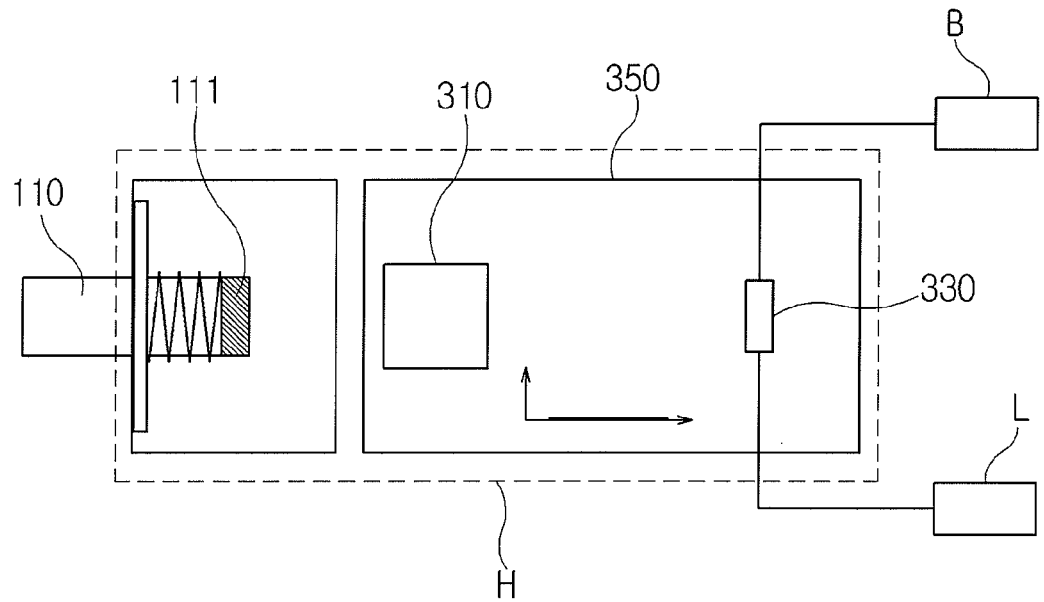
FIGS. 5 and 6 are exemplary views illustrating a non-contact switch according to a third embodiment of the present invention.
Figure 6:
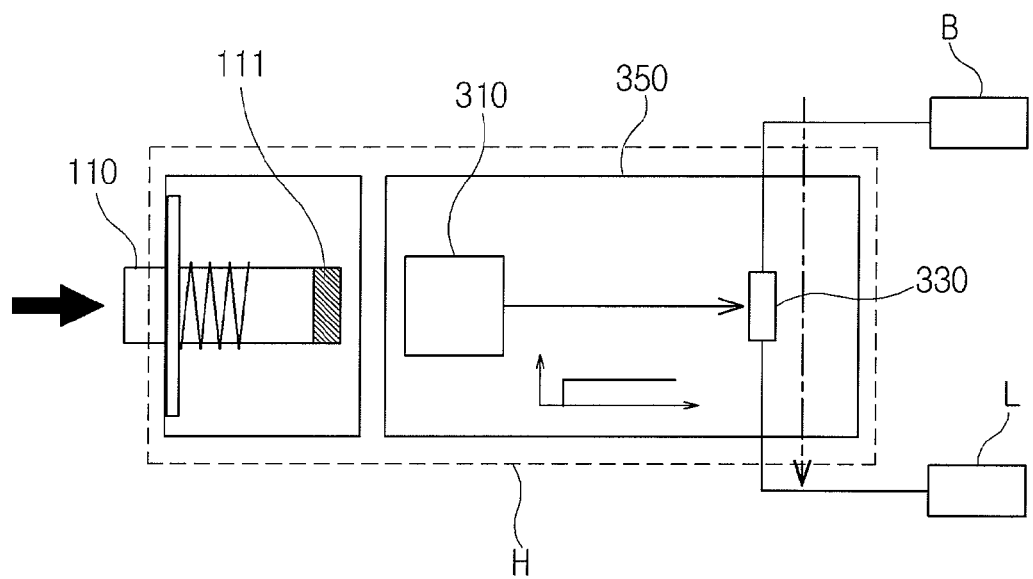

Hereinafter, a non-contact switch according to a third embodiment of the present invention will be described in detail with reference to the accompanying exemplary drawings. FIGS. 5 and 6 are exemplary views illustrating the non-contact switch according to the third embodiment of the present invention.

As shown in FIG. 5, the non-contact switch according to the present invention includes a button 110 which is disposed at a left surface of a housing H and operated by an external pressure while being formed, at a right end portion thereof, with a magnetic substance 111, a hall device as a magnetic field sensor device 310 which is disposed on a PCB 350 accommodated within the housing H, and an IPS device as a semiconductor device 330.

In this case, as shown in FIG. 6, when an external pressure is applied to the button 110, the button 110 is preferably operated in a push manner, namely, to move toward a right surface of the housing H at which the button 110 is disposed, but the invention is not limited thereto.

As described above, when a clearance between the hall device and the magnetic substance 111, which is formed at the right end portion of the button 110, is decreased as the button 110 moves toward the right surface of the housing H from the left surface thereof in response to the external pressure, an induced voltage is generated at the hall device, thereby turning on the IPS device. Consequently, a current is output from a separate battery B connected to an input terminal of the IPS device via the IPS device. In this case, the IPS device switches the flow of the current so that the current flows from the separate battery B via an electric path formed on the PCB 350 to a separate load L.

In contrast, when the clearance between the hall device and the magnetic substance 111, which is formed at the right end portion of the button 110, is increased as the button 110 moves toward the left surface of the housing H from the right surface thereof in response to the external pressure, the generation of the induced voltage at the hall device is stopped, thereby turning off the IPS device. Consequently, the IPS device switches the flow of the current so that the current flowing from the separate battery B via the electric path formed on the PCB 350 to the separate load L is cut off.

Although the present invention has been described with respect to the illustrative embodiments, it should be understood that numerous other modifications and variations may be devised by those skilled in the art that will fall within the intrinsic aspects of the embodiments. Furthermore, various variations and modifications are possible in concrete constituent elements of the embodiments. In addition, it is to be understood that differences relevant to the variations and modifications fall within the spirit and scope of the present invention defined in the appended claims.

[Description of the Reference Numerals]

| | |
|---|---|
| B: separate battery | L: separate load |
| H: housing | |
| 100: button | 111: magnetic substance |
| 310: magnetic field sensor device | |
| 330: semiconductor device | |
| 350: PCB (Printed Circuit Board) | |

What is claimed is:

1. A non-contact switch for controlling a current supplied from a separate battery B to a separate load L, comprising:
   a button which is disposed at a predetermined position of a housing H and operated by an external pressure while being formed, at one end portion thereof, with a magnetic substance;
   a magnetic field sensor device which is accommodated in the housing H to face the magnetic substance and generates an induced voltage depending on an interval between the magnetic field sensor device and the magnetic substance; and
   a semiconductor device which is driven by the induced voltage generated at the magnetic field sensor device to switch power supplied from the separate battery B to the separate load L.

2. The non-contact switch according to claim 1, wherein the magnetic field sensor device is any one of a hall device, a reed switch, an AMR (Anisotropic Magneto-Resistive) sensor, and a GMR (Giant Magneto-Resistive) sensor.

3. The non-contact switch according to claim 1, wherein the semiconductor device is any one of a FET (Field Effect Transistor), a transistor, an electromagnetic relay, an IPS (Intelligent Power Switching) device, a MOSFET (Metal Oxide Semiconductor Field Effect Transistor), and an IGBT (Insulated Gate Bipolar Transistor).

4. The non-contact switch according to claim 1, wherein the button is operated in a push manner by an external pressure at a predetermined position of the housing H, or in a sliding manner by an external pressure at a predetermined position of the housing H.

5. The non-contact switch according to claim 1, wherein the magnetic field sensor device is disposed on a PCB (Printed Circuit Board).

6. The non-contact switch according to claim 1, wherein the semiconductor device is disposed on a PCB.

7. The non-contact switch according to claim 1, wherein the power is any one of a current and a voltage.

* * * * *